US008215009B2

(12) United States Patent
Early et al.

(10) Patent No.: US 8,215,009 B2
(45) Date of Patent: Jul. 10, 2012

(54) METHOD FOR MANUFACTURING A PLUG ARM

(75) Inventors: Malcolm Early, Mountain View, CA (US); Brandon Connors, San Francisco, CA (US); Kevin Walsh, Burlingame, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/215,660

(22) Filed: Aug. 23, 2011

(65) Prior Publication Data

US 2012/0005897 A1 Jan. 12, 2012

Related U.S. Application Data

(62) Division of application No. 12/363,452, filed on Jan. 30, 2009, now Pat. No. 8,021,183.

(60) Provisional application No. 61/110,474, filed on Oct. 31, 2008.

(51) Int. Cl.
*H05K 3/30* (2006.01)

(52) U.S. Cl. ................ 29/838; 29/844; 29/845; 29/861; 29/874; 29/881

(58) Field of Classification Search .................... 29/838, 29/844, 845, 861, 874, 881; 439/382, 384, 439/392, 694, 594, 692, 693, 741
See application file for complete search history.

(56) References Cited

U.S. PATENT DOCUMENTS 1,914,944 A 6/1933 Eckstein
2,291,837 A 8/1942 Sheehan
2,537,370 A 1/1951 Parnes
2,947,914 A 8/1960 Simons
3,636,495 A 1/1972 Forsyth, Jr.
(Continued)

FOREIGN PATENT DOCUMENTS

CN 2178392 9/1994
(Continued)

OTHER PUBLICATIONS

Office Action for U.S. Appl. No. 12/135,044, mailed Jul. 8, 2009 (US Publication No. 20090305578).

(Continued)

*Primary Examiner* — Derris Banks
*Assistant Examiner* — Tai Nguyen
(74) *Attorney, Agent, or Firm* — Kramer Levin Naftalis & Frankel LLP

(57) ABSTRACT

This is directed to a power adapter plug arm manufactured from a single piece of material. The plug arm can include a plug operative to extend into a wall socket, an elongated plate coupled to an end of the plug such that the plug extends from a first surface of one end of the plate, and a pin coupled to the opposite end of the plate and extending from the opposite surface of the plate. The pin can be operative to engage a circuit board of the power adapter to provide power received from the wall socket to an electronic device coupled to the power adapter. To enhance the strength of the plug arm, the plate can be manufactured by creating a co-axial plug and a stem from a single piece of material, bending the stem, and cold heading the bent portion of the stem to form a plate. Because the cold heading process involves cold working the material, the arm and in particular the bridge member at the interface between the plate and the stem can become stronger as a result of the manufacturing process.

16 Claims, 5 Drawing Sheets

U.S. PATENT DOCUMENTS

| | | | | |
|---|---|---|---|---|
| 4,028,654 | A | 6/1977 | Bullard et al. | |
| 4,375,308 | A | 3/1983 | Wilkinson | |
| 5,046,971 | A * | 9/1991 | Ruggiero et al. | 439/741 |
| 5,106,317 | A | 4/1992 | Taylor | |
| 5,119,204 | A | 6/1992 | Hashimoto et al. | |
| 5,171,168 | A | 12/1992 | Chiodo | |
| 5,224,879 | A | 7/1993 | Mullins et al. | |
| 5,242,319 | A | 9/1993 | Ju | |
| 5,281,172 | A | 1/1994 | Luu | |
| 5,494,449 | A | 2/1996 | Chiodo | |
| 5,616,051 | A | 4/1997 | Rogers et al. | |
| 5,626,495 | A | 5/1997 | Drewnicki | |
| 5,641,311 | A | 6/1997 | Chuang | |
| 5,755,820 | A * | 5/1998 | Lan-Jen | 439/694 |
| 5,911,600 | A | 6/1999 | Mosquera | |
| 6,297,982 | B1 | 10/2001 | Wu | |
| 6,312,271 | B1 | 11/2001 | Tseng | |
| 6,488,540 | B2 | 12/2002 | Coyle, Jr. et al. | |
| 6,505,402 | B2 | 1/2003 | Moriwake et al. | |
| 6,527,596 | B1 | 3/2003 | Su | |
| 6,644,984 | B2 | 11/2003 | Vista, Jr. et al. | |
| 6,846,203 | B1 | 1/2005 | Su | |
| 6,848,918 | B2 * | 2/2005 | Chuang | 439/106 |
| 6,851,955 | B2 | 2/2005 | Chen | |
| 6,860,743 | B2 | 3/2005 | Ekkul et al. | |
| 6,981,896 | B2 | 1/2006 | Su | |
| 7,101,226 | B1 | 9/2006 | Gilliland | |
| 7,118,425 | B2 * | 10/2006 | Chen | 439/736 |
| 7,207,809 | B2 | 4/2007 | Sasaki et al. | |
| 7,212,420 | B2 | 5/2007 | Liao | |
| 7,287,991 | B1 | 10/2007 | Li | |
| 7,344,385 | B2 | 3/2008 | Chen | |
| 7,499,301 | B2 | 3/2009 | Zhou | |
| 7,573,159 | B1 | 8/2009 | Deluliis et al. | |
| 2003/0148665 | A1 | 8/2003 | Su | |
| 2004/0204177 | A1 | 10/2004 | Pon | |
| 2009/0227122 | A1 | 9/2009 | Jubelirer et al. | |
| 2009/0305565 | A1 | 12/2009 | Stiehl et al. | |
| 2009/0305578 | A1 | 12/2009 | Lim et al. | |
| 2010/0159755 | A1 | 6/2010 | Lin et al. | |

FOREIGN PATENT DOCUMENTS

| | | |
|---|---|---|
| CN | 2257965 | 7/1997 |
| CN | 200963813 | 10/2007 |
| CN | 101154819 | 4/2008 |
| CN | 201112509 | 9/2008 |
| JP | 2002149285 | 5/2002 |
| JP | 2003-36912 | 2/2003 |
| WO | 97/01199 | 1/1997 |

OTHER PUBLICATIONS

Final Rejection for U.S. Appl. No. 12/135,044, mailed Mar. 25, 2010 (US Publication No. 20090305578).

Advisory Action for U.S. Appl. No. 12/135,044, mailed Jun. 2, 2010 (US Publication No. 20090305578).

* cited by examiner

METHOD FOR MANUFACTURING A PLUG ARM

CROSS-REFERENCE TO RELATED APPLICATION

This application is a divisional of U.S. application Ser. No. 12/363,452, filed Jan. 30, 2009, now U.S. Pat. No. 8,021,183 which claims priority to U.S. Provisional Application No. 61/110,474, filed Oct. 31, 2008, which are fully incorporated by reference herein in their entirety.

BACKGROUND OF THE INVENTION

This is directed to providing an electric plug constructed from a single piece of material using a cold working process.

Power adapters include two or more plug arms that extend from a body to interface with wall sockets. To provide power from the arms to an electronic device, the power adapter can include one or more cables connecting the arms to an adapter operative to engage the electronic device. The arms can connect to the cables using any suitable approach, including for example via a pin that is soldered to the cables. As another example, a pin can be inserted in a circuit board operative to transform and direct power to the cables.

Some power adapters can include additional connectors or components for providing enhanced functionality. For example, some power adapters can include one or more USB, FireWire, 30-pin, or other connectors. The connectors can be fully integrated in the power adapters to provide a compact component that the user can easily carry and use. Integrating other connectors or components in a power adapter can restrict the space available for the arms to connect to the cables. In particular, if a connector is positioned immediately behind an arm, there may be insufficient space to route a cable around the connector to connect to the arm, or the connector can prevent substantially all direct access to the arm.

To accommodate the connector while retaining a small profile, one or more of the arms can include a plate extending from the base of the arm and providing a conductive path to a pin used for connecting to cable. The plate can be coupled to the arm and pin using any suitable approach. For example, the plate can be coupled to the arm using a screw, mechanical fastening mechanism (e.g., a pin passing through an opening and expanding), welding, soldering, or other coupling mechanism. While these approaches may allow an electrical current to pass from the arm to the pin, the inherent weakness due to connecting two distinct components together can cause the power adapter to fail.

SUMMARY OF THE INVENTION

This is directed to a power adapter plug arm having an integral plate for conducting power to a pin. The arm and plate can be constructed from a single piece of material using a bending and cold heading process.

The power adapter plug arm can include a plug operative to extend into a wall socket. The particular dimensions of the plug can be defined using any suitable standard, including for example the national standards agency of individual countries. A plate substantially perpendicular to the plug can be coupled to the end of the plug (e.g., the end that is not inserted into the wall socket) to provide a path between the plug and a cable extending from the power adapter. The plate can be substantially elongated, and positioned such that the plug extends from a first end of the plate and a pin connecting the plug to a circuit board extends from a second end of the plate.

To increase the strength of the arm, the plug and plate can be constructed using a cold working process using a single piece of material, such as a single piece of brass or steel.

Any suitable manufacturing process or combination of manufacturing processes can be used to manufacture a power adapter arm from a single piece of material (e.g., brass or steel). In some embodiments, a block of material can first be drawn through a die to form a rectangular bar. The bar can be milled to form the power adapter plug, and lathed to form a tubular stem extending from the power adapter plug such that the plug and stem are substantially co-axial. To form the plate, the tubular stem may be bent, for example substantially perpendicular to the plug axis. The bent stem can be cold headed to flatten the stem and form a substantially flat plate. The plate can then be grinded or machined to shape the periphery of the plate, and a pin can be coupled to the opposite end of the plate such that it extends from the opposite surface of the plate as the stem and plug. Once the final shape has been reached, the arm can be finished for aesthetic purposes, for example using sand blasting and nickel plating. By bending the stem and cold heading the bent stem, the strength of the plate-stem interface (e.g., the strength of a bridging portion connecting the stem to the plate) can be increased by cold work, thus further improving the stiffness and strength of the power adapter arm and reducing failures due to fatigue use.

BRIEF DESCRIPTION OF THE DRAWINGS

The above and other features of the present invention, its nature and various advantages will be more apparent upon consideration of the following detailed 100 description, taken in conjunction with the accompanying drawings in which.

DETAILED DESCRIPTION

Figure 1:
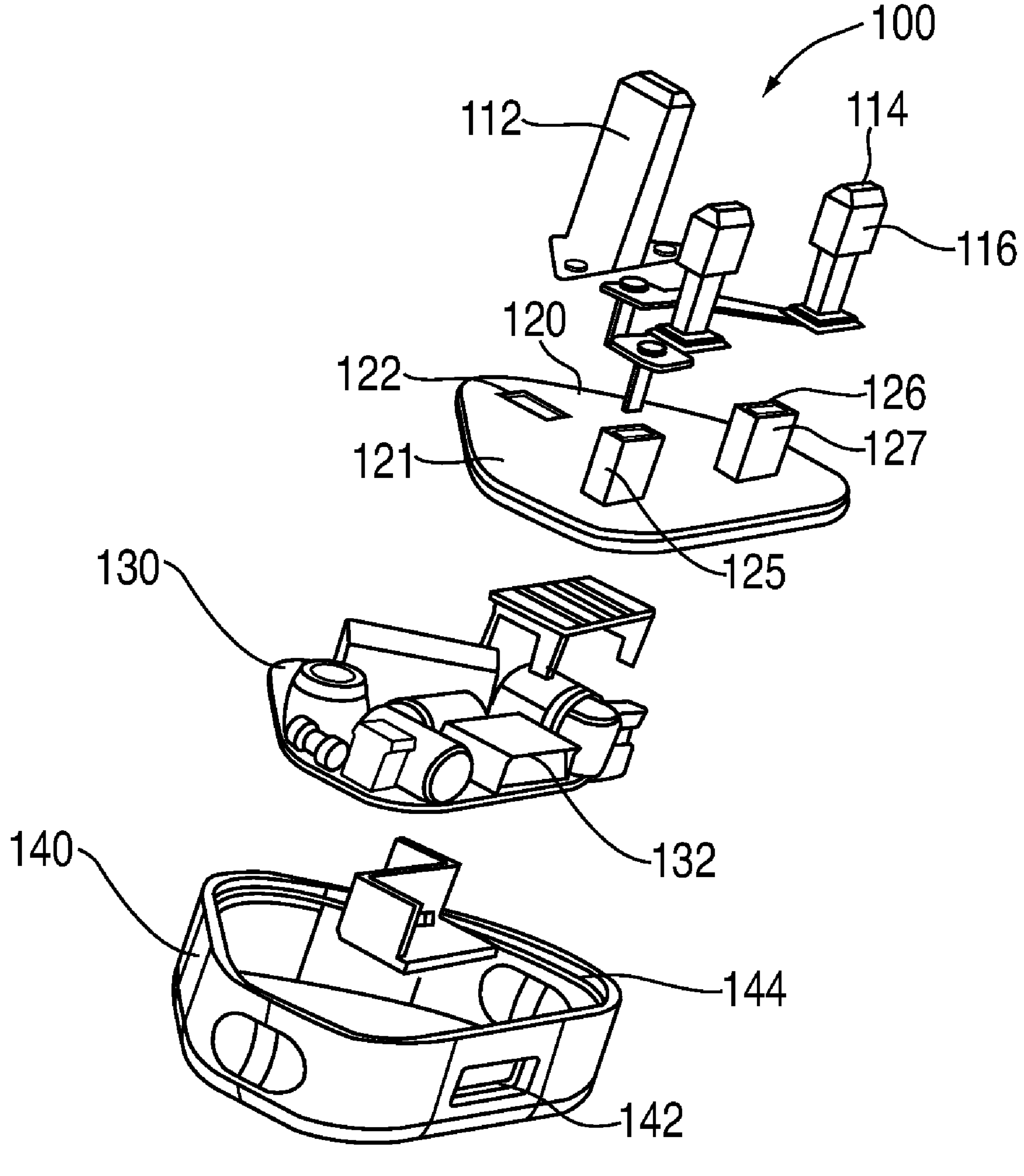
FIG. 1 is an exploded view of an illustrative power adapter having a plug arm formed from a single piece of material in accordance with one embodiment of the invention.
Figure 1A:
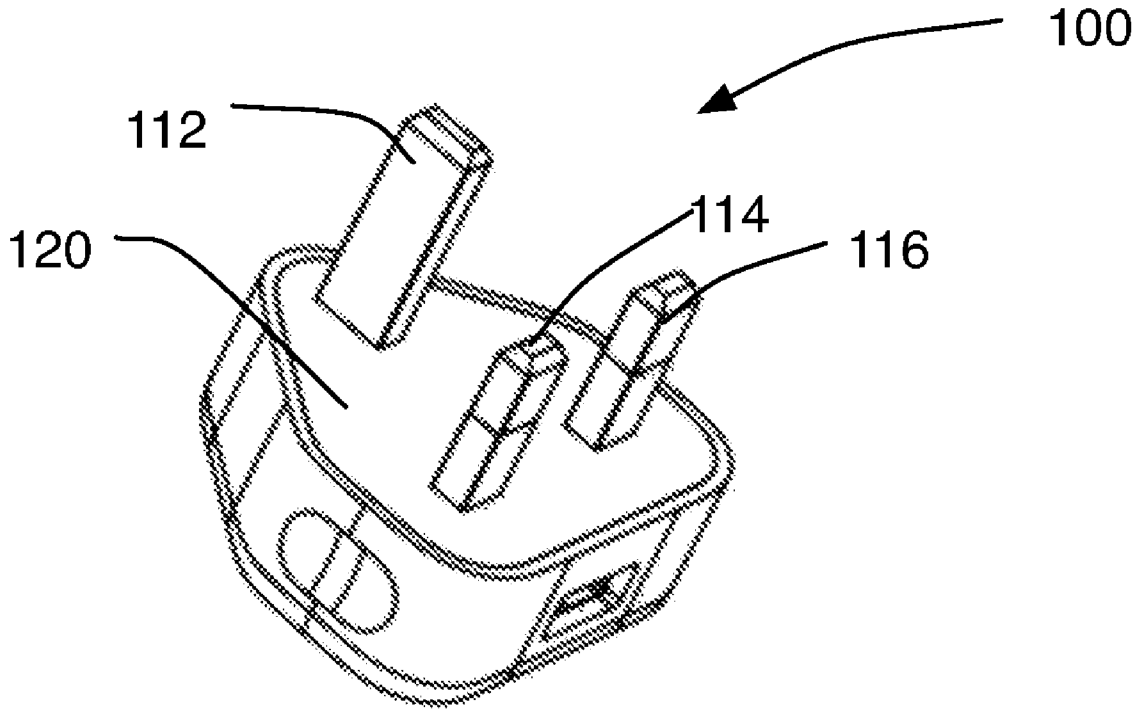
FIG. 1A is a perspective view of an illustrative power adapter having a plug arm formed from a single piece of material in accordance with one embodiment of the invention.

FIG. 1 is an exploded view of an illustrative power adapter having a plug arm formed from a single piece of material in accordance with one embodiment of the invention. Power adapter 100 can include ground plug arm 112, first AC plug arm 114 and second AC plug arm 116. The plug arms can be retained by front cap 120, which can serve as an exterior surface of power adapter 100. In particular, front cap 120 can include cosmetic surface 121 that may be visible to a user when power adapter 100 is assembled. Front cap 120 can include openings 122, 124 and 126 for receiving each of plug arms 112, 114 and 116, respectively. In some embodiments, front cap can include protrusions 125 and 127 extending beyond the surface of cosmetic surface 121. The size and length of protrusions 125 and 127 can be selected based on any suitable criteria, including for example the dimensions and shapes of AC plug arms 114 and 116, and standards set for power adapters by various national or international bodies. Plug arms 112, 114 and 116 can be placed in front cap 120 using any suitable approach. For example, front cap 120 can be molded over plug arms 112, 114 and 116, for example as shown in FIG. 1A. As another example, the shape and sizes of plug arms 112, 114 and 116 can allow the plug arms to be inserted into the corresponding openings of front cap 120, for example from cosmetic surface.

Each of plug arms 112, 114 and 116 can be connected to particular portions of circuit board 130. For example, circuit board 130 can include leads operative to direct power from a remote source (e.g., a wall socket) to an electronic device requiring power. Power adapter 100 can connect to an electronic device using any suitable approach, including for example via connector 132. Connector 132 can include any suitable type of electronic connector that supports the transfer of power, including for example a USB, AT, SATA, Molex, Firewire, PCI, or any other suitable powered connector. In some embodiments, circuit board 130 can instead or in addition include wires or cables directly connecting the circuit board to the electronic device. The components of circuit board 130, including the leads for receiving each of plug arms 112, 114 and 116 can be distributed based on any suitable criteria, including for example based on space considerations (e.g., to minimize the size of power adapter 100). In some embodiments, the distribution of circuit board components can require one or more the leads for receiving each of plug arms 112, 114 and 116 to be positioned away from the portions of plug arms 112, 114 and 116 that extend from front cap 120. In particular, the leads can be located such that each of plug arms 112, 114 and 116 cannot simply extend in the same axis as the plug arm to connect to the circuit board, but require a bridging portion to connect the plug arm to the circuit board (e.g., as shown in plug arms 114 and 116).

Power adapter 100 can include enclosure 140 for receiving circuit board 130 and protecting the circuit board components from damage due to the environment. In addition, enclosure 140 can be electrically isolating to prevent electrical charges from travelling from the wall socket to plug arms 112, 114 and 116, and to the user's hand. Enclosure 140 can be constructed from any suitable material, including for example plastic, a ceramic material, or any other suitable isolating material. Enclosure 140 can include opening 142 for providing access to connector 132. Enclosure 140 can include lip 144 operative to receive front cap 120 to assemble power adapter 100. Front cap can be coupled to enclosure 140 using any suitable approach, including for example an adhesive (e.g., placed on lip 144), a press fit, interlocking features of the front cap and enclosure (e.g., tabs extending into corresponding slots), a mechanical fastener, welding (e.g., ultrasonic welding), or any other suitable approach.

When, due to space or other considerations, a plug arm includes a bridging portion, additional stresses can be introduced in the power adapter. In particular, the connection between the plug stem and the plate forming the bridging portion can be at a large angle (e.g., substantially a perpendicular connection), and the length of the plate can create a large aspect ratio relative to the stem, which can combine to generate a significant bending moment. Then, forces applied to the plug arm during normal use (e.g., as a user manipulates the power adapter to plug it into a wall socket) can be transferred to the plate-plug interface and cause fatigue or other stresses.

Figure 2A:
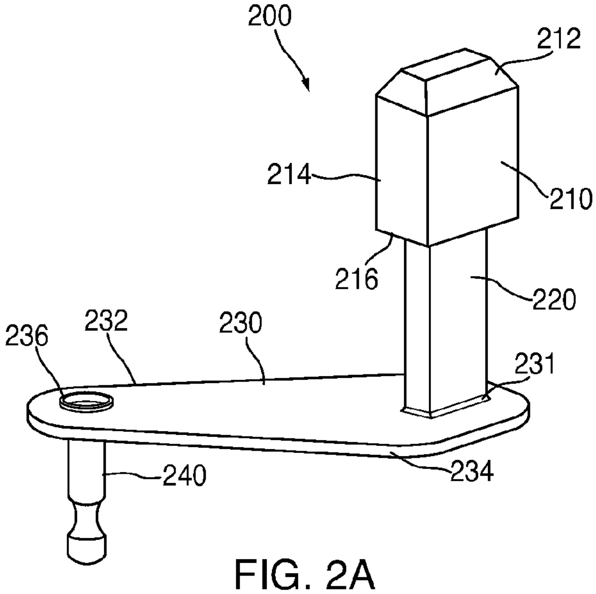
FIGS. 2A and 2B are perspective views of an illustrative plug arm for use in a power adapter in accordance with one embodiment of the invention.
Figure 2B:
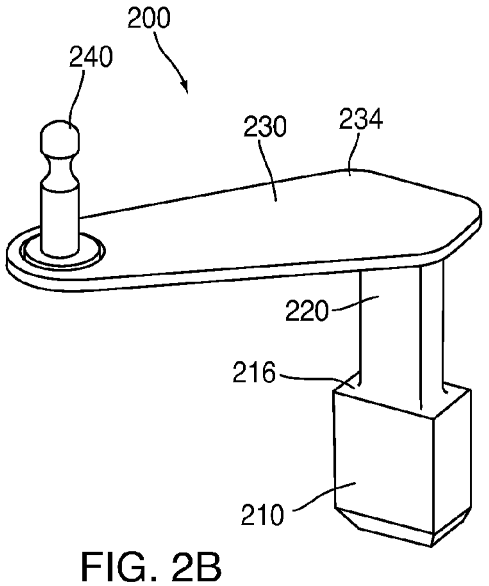

To ensure that the plug stem-plate connection can resist the applied stresses, the plug arm can be constructed from a single piece of material. FIGS. 2A and 2B are perspective views of an illustrative plug arm for use in a power adapter in accordance with one embodiment of the invention. Arm 200 can include plug 210 operative to be inserted in a power socket. Plug 210 can have any suitable dimension (e.g., 4.0 mm×8.70 mm×6.30 mm), including for example dimensions set by national or international standards agencies. In the example of FIGS. 2A and 2B, plug 210 corresponds to the plugs used in the United Kingdom, though it will be understood that any other suitable plug dimension can be used. Plug 210 can include tip 212 that can be tapered, body 214, and end 216. Stem 220 can extend from end 216 in substantially the same axis as plug 210. In some embodiments, arm 200 may not include stem 220, but plug 210 may instead extend the combined lengths of plug 210 and stem 220 (e.g., if the plug standard does not include a stem covered by non-conductive material, such as in the United States). Stem 220 can have any suitable dimensions, including for example a length set by a standards body (e.g., 10.0 mm length). In some embodiments, stem 220 can have a smaller cross-section than plug 210 such that a layer of a second material can be placed around the periphery of stem 220 without extending past the boundary of plug 210 (e.g., protrusion 127, FIG. 1, fits around the stem). Stem 220 can have any suitable cross-section, including for example a circular cross-section, a rectangular cross-section, a cross-section matching or substantially similar to the cross-section of plug 210, or any other suitable cross-section. In some embodiments, the cross-section of stem 220 can be selected based on manufacturing criteria, including for example to ensure that a front cap molded over stem 220 properly adheres to the stem sidewalls (e.g., requiring a rectangular or polygonal cross-section instead of a circular cross-section).

Arm 200 can include plate 230 coupled to the end of stem 220 such that stem 220 extends from first surface 232 of plate 230. The plane of plate 230 can be angled relative to the axis of plug 210 and stem 220. For example, plate 230 can be substantially perpendicular to the axis of plug 210 and stem 220. In some embodiments, the angle may be at least 45 degrees, so that the aspect ratio of plate 230 and plug 210 is relatively large. Plate 230 can be coupled to stem 220 using any suitable component, including for example a bridging portion constructed from the same piece of material as arm 200 (e.g., bridging portion 231). Plate 230 can have any suitable thickness, periphery, or other characteristic length. For example, plate 230 can be 1.0 mm thick, and the components extending from plate 230 can be centered at opposite corners of a 13.23 mm×12.55 mm rectangle. In some embodiments, the thickness and periphery of plate 230 can be selected based on constraints set by the components on a circuit board, or constrains in the top cap or in the top cap manufacturing.

In some embodiments, plate 230 can be substantially elongated such that stem 220 extends from a first end of plate 230. Plate 230 can include aperture 236 at a second end of plate 230 that is opposite the first end. Pin 240, which can extend from second surface 234 of plate 230 (e.g., extend from the opposite surface as stem 220), can be operative to engage or electrically connect with a circuit board of the power adapter (e.g., circuit board 130, FIG. 1). Pin 240 can have any suitable cross-section (e.g., diameter) or length, including for example a diameter and length determined by the distance between arm 200 and the circuit board, and the size of the opening or port in the circuit board for receiving pin 240. Pin 240 can extend from plate 230 at any suitable angle, including for example substantially perpendicular to the plane of plate 230, substantially in the same orientation as stem 220, or at any other suitable angle. Pin 240 can be coupled to plate 230 using any suitable approach, including for example by inserting pin 240 into aperture 236 and fastening the pin (e.g., using a rivet), with a mechanical fastener (e.g., a screw), soldering, swaging, welding, an adhesive, or any other suitable coupling mechanism. In some embodiments, the coupling mechanism can be selected to ensure that power or other signals can propagate from plate 230 into pin 240.

Figure 3A:
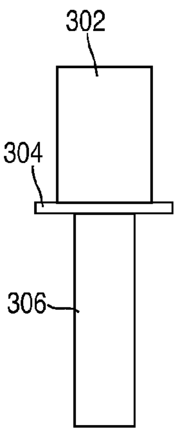
FIG. 3A is a schematic view of a cold draw operation in accordance with one embodiment of the invention.
Figure 3B:
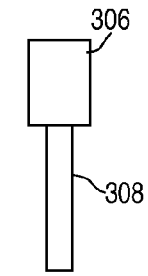
FIG. 3B is a schematic view of a lathing operation for creating a stem in accordance with one embodiment of the invention.
Figure 3C:
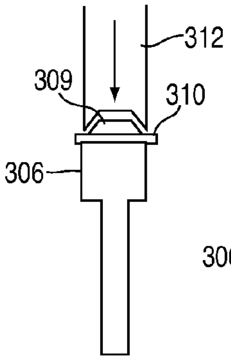
FIG. 3C is a schematic view of a cold heading operation for shaping a plug in accordance with one embodiment of the invention.

Any suitable process or combination of processes can be used to construct arm 200 from a single piece of material. For example, a sequence of cold-working processes can be used to form arm 200. FIGS. 3A-3G are schematic views of successive cold-working operations that can be used to manufacture a power adapter plug arm in accordance with one embodiment of the invention. FIG. 3A is a schematic view of a cold draw operation in accordance with one embodiment of the invention. As shown in FIG. 3A, block 302 of material, for example a block of brass or steel can be drawn through die 304 to create bar 306. Bar 306 can have any suitable dimension, including for example substantially the final dimension of an electrical plug. Once the bar is formed, the stem can be defined. FIG. 3B is a schematic view of a lathing operation for creating a stem in accordance with one embodiment of the invention. Bar 306 can be placed in a lathe and cut to create stem 308. The length of stem 308 can be selected based on any suitable criteria, including for example the final lengths of stem and plate required for the arm, the length of the plug, combinations of these, or any other suitable criteria. Once the stem has be constructed, bar 306 can be placed in carrier 310 such that a portion of bar 306 extends from the top surface of carrier 310, while the stem remains underneath the top surface of carrier 310 (e.g., as shown in FIG. 3C). In some embodiments, bar 306 can be placed in carrier 310 prior to or as part of the lathing operation. Once the stem has been formed, the plug can be shaped. FIG. 3C is a schematic view of a cold heading operation for shaping the plug in accordance with one embodiment of the invention. In some embodiments, the portion of bar 306 that will form the plug can be exposed in carrier 310 so that tool 312 can be applied to the exposed portion of bar 306. Tool 312 may be operative to define the basic geometry of plug 309, trim or stamp particular head features, or perform any other suitable operation (e.g., cutting, milling, compressing, or bending) to finalize the plug shape. In some embodiments, tool 312 can perform a cold head strike to shape plug 309, or instead or in addition be used in a forging, trimming, or stamping operation. Although the order of FIGS. 3B and 3C show stem 308 created before plug 309, it will be understood that the order of these processes is purely illustrative and can be changed without departing from the invention.

Figure 3D:
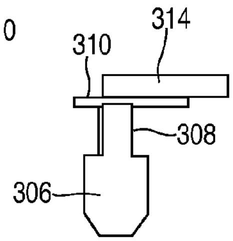
FIG. 3D is a schematic view of an illustrative bending process for defining the end of the stem in accordance with one embodiment of the invention.

Once the plug has been formed, the plate that is coupled to the end of the plug can be constructed. FIG. 3D is a schematic view of an illustrative bending process for defining the end of the stem in accordance with one embodiment of the invention. Bar 306 can be moved in carrier 310 (or to a different carrier) such that bar 306 is retained in the carrier by stem 308. The distance between the base of stem 308 and carrier 310 (e.g., the top or bottom surface of carrier 310) can be selected based on any suitable criteria, including for example electrical plug standards defined by appropriate organizations (e.g., so that the stem length, or combined plug and stem length is a predetermined length). The portion of stem 308 extending beyond the top surface of carrier 310 can be bent to place the material 314 that will become the plug arm plate. The bent portion of stem 308 (e.g., material 314) can have any suitable length, including for example at least half of the length of stem 308 and plug 309, substantially the same length as stem 308 and plug 309, or longer than the length of stem 308 and plug 309. Stem 308 can be bent at any suitable angle, including for example substantially perpendicular to the axis of plug 309. To ensure that stem 308 is bent by the proper amount, stem 308 can be bent until it is substantially flush with the top surface of carrier 310. Thus, the relative angle between stem 308 and carrier 310 can be used to accurately define the angle between stem 308 and material 314.

Figure 3E:
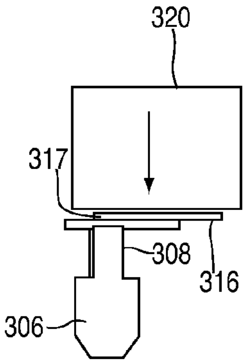
FIG. 3E is a schematic view of an illustrative cold heading process for forming a plug arm plate in accordance with one embodiment of the invention.

To shape substantially round (e.g., lathed) material 314 into the flat plate of the plug arm, another cold heading operation can be performed. FIG. 3E is a schematic view of an illustrative cold heading process for forming a plug arm plate in accordance with one embodiment of the invention. Tool 320 can be applied to material 314, which can be substantially circular or elliptical, to form substantially flat plate 316 having a proximal end adjacent to the bending location and a distal end adjacent to the free end of the bent material. Tool 320 and carrier 310 can be designed to interface in a manner to ensure that plate 316 has any suitable width (e.g., 1 mm) and any suitable periphery. For example, tool 320 can include a die to trim portions of plate 316 that extend beyond a desired periphery or dimensions. By using tool 320 to provide a cold head strike on material 314, the crystal properties of material 314 can be re-aligned to relieve stresses created when stem 308 was bent, and strengthen bridging portion 317 between the end of stem 308 and plate 316. The cold heading can therefore provide a stronger interface than coupling a separate stem and plate together, while providing an efficient manufacturing process.

Figure 3F:
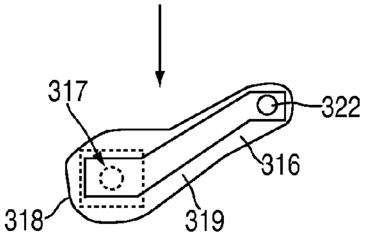
FIG. 3F is a schematic top view of an illustrative finished plug arm plate in accordance with one embodiment of the invention.
Figure 3G:
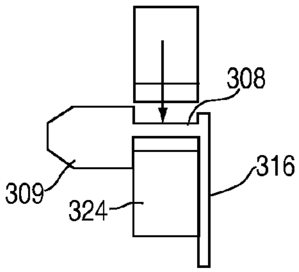
FIG. 3G is a schematic view of an illustrative process for shaping the stem in accordance with one embodiment of the invention.

Once plate 316 has the appropriate width, plate 316 can be processed to refine the shape of the plate, punch one or more holes for receiving a pin (e.g., pin 240, FIG. 2), and remove or erase manufacturing marks (e.g., marks due to carrier 310). FIG. 3F is a schematic top view of an illustrative finished plug arm plate in accordance with one embodiment of the invention. Plate 316 can include any suitable shape, including for example expanded portion 318 adjacent to bridging portion 317 and elongated portion 319 extending to the opposite end of plate 316. In some embodiments, a punching process can be performed to create aperture 322 (e.g., for a pin). After plate 316 has been finished, stem 308 can be re-shaped to provide a cross-section or sidewalls better suited to adhere to material molded around stem 308 and arm 300. FIG. 3G is a schematic view of an illustrative process for shaping the stem in accordance with one embodiment of the invention. Tool 324 can be applied to stem 308 to refine the shape of stem 308 using any suitable approach, including for example removing some or all curved surfaces of stem 308, or compressing or cutting portions of stem 308. It will be understood that the steps or processes shown in FIGS. 3A-3G are merely illustrative, and that other processes can be used instead or in addition of those shown (e.g., couple the pin to the end of plate 316, and include sand blasting and nickel plating processes), and the order of the processes is merely illustrative and can be changed to suit any suitable purpose.

Figure 4:
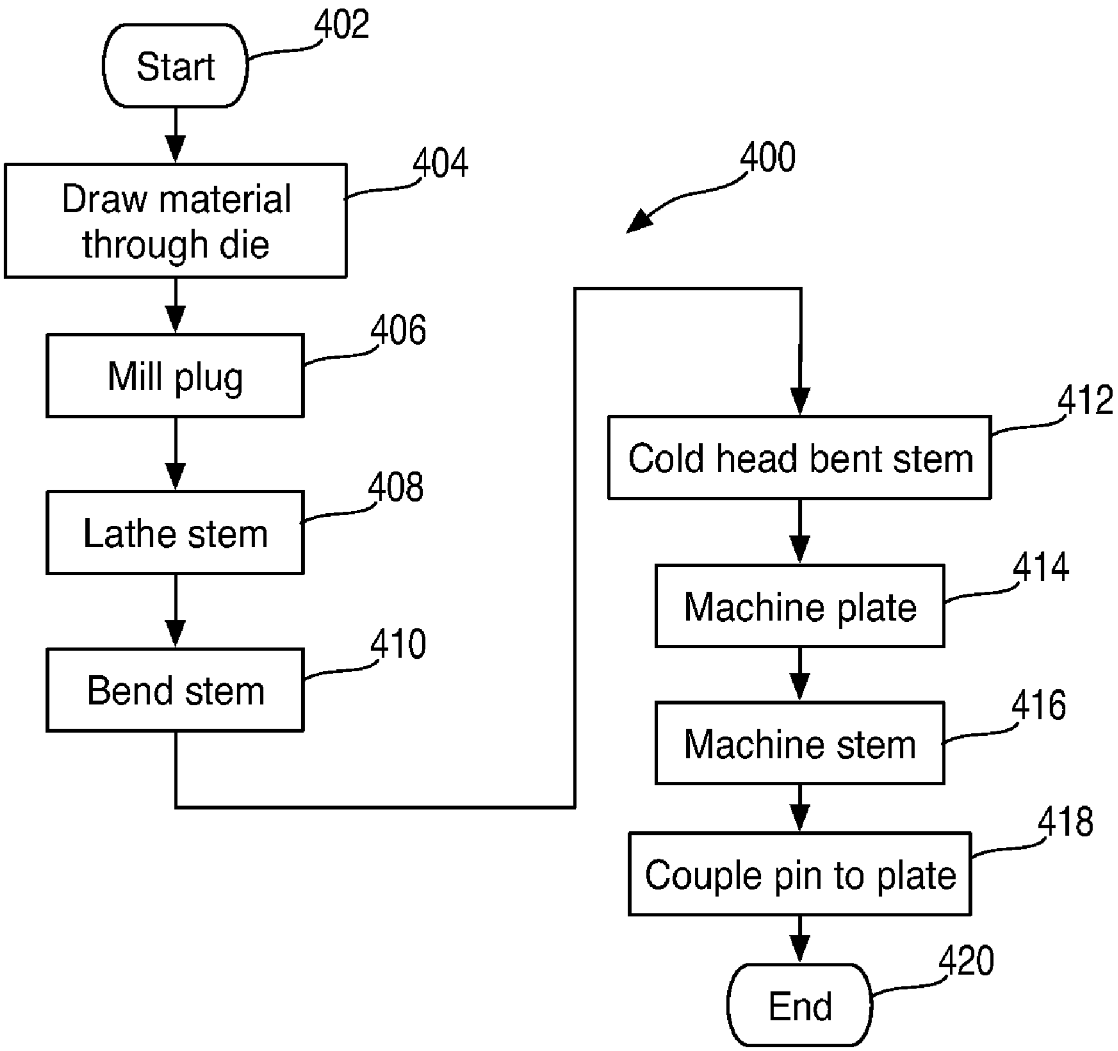
FIG. 4 is a flowchart of an illustrative process for manufacturing a power adapter arm from a single piece of material in accordance with one embodiment of the invention.

FIG. 4 is a flowchart of an illustrative process for manufacturing a power adapter arm from a single piece of material in accordance with one embodiment of the invention. It will be understood that the order of steps in process 400 is merely illustrative, and that particular steps can be removed or added without departing from the invention. Process 400 can begin at step 402. At step 404, the material used for the power adapter arm can be drawn through a die. For example, a brass or steel block can be drawn through a die to create a rectangular bar. The cross-section of the drawn bar can be substantially the same as the cross-section of the plug used in a power adapter (e.g., the drawn block could be inserted in a wall outlet). In some embodiments, the die can define other shapes for the drawn block, including for example circular or oval cross-sections (e.g., based on the set dimensions of electrical plugs for the market in which the arm is to be used). At step 406, a first portion of the drawn material can be milled, worked, machined, or combinations of these and other processes to form the power adapter plug. For example, a first end of the block can be milled to form the plug. The milling, working or machining process can remove any suitable amount of material, including for example sufficient material for the remaining plug to satisfy the specifications set by an appropriate standards agency for electrical plugs.

At step 408, the end of the bar opposite the plug can be lathed to form an elongated tubular structure extending from the base of the plug, and substantially along the same axis as the plug. The tubular structure can define a stem having a length at least equal to the sum of lengths of the plug adapter stem and plate. The stem can have any suitable diameter or other characteristic length (e.g., if the stem has an elliptical cross-section). In particular, the diameter or characteristic length can be selected such that the volume of material is sufficient to form a plate having suitable dimensions when compressed (e.g., the volume of the stem is at least equal to the volume of the plate). Although this process describes the stem as being circular, it will be understood that the stem can have any suitable cross-section or other characteristic dimension (e.g., a rectangular cross-section). At step 410, the stem can be bent. For example, a press can be used to bend the stem to any suitable angle. In particular, the angle can be selected based on space requirements or other constraints within the power adapter (e.g., a substantially right angle, or any other angle based on the relative positions of the arm and other components in the power adapter). The stem can be bent at any suitable distance from the plug, including for example at a minimal distance for allowing another material to be molded over the stem (e.g., 10 mm). As another example, the stem can be bent at a distance from the plug such that the bent portion of the stem is at least equal to the length of the plate. As still another example, the stem can be bent at a distance from the plug defined by a standards agency.

At step 412, the bent portion of the stem can be cold headed or cold worked to flatten the bent portion of the stem and form a plate. The tool used for the cold heading process can include a die to substantially shape the plate (e.g., remove excess material during the cold heading to define the periphery of the plate). The force applied during the cold heading process and the die properties can be selected based any suitable criteria, including for example to provide a plate having a thickness within a desired range (e.g., 1 mm). At step 414, the plate can be machined, worked or ground to refine the shape of plate. For example, the plate can be trimmed to define the final periphery of the plate, one or more holes can be drilled or punched, tooling or fixture marks can be removed (e.g., by polishing the plate), or any other finishing process can be applied.

At step 416, the stem can be machined to provide surfaces better adapted to adhering to a material molded over the arm. For example, the rounded stem can be machined to create a substantially rectangular stem. In some embodiments, if the stem created at step 408 has sufficient surfaces to adhere to the molded material, step 416 can be skipped. At step 418, a pin can be coupled to the end of the plate. For example, a pin can be placed in a hole drilled at the end of the plate and fixed using a mechanical fastener (e.g., rivet or a screw) or a material deforming process (e.g., staking). The pin can extend from the opposite end of the plate as the stem and plug, and extend from the opposite surface of the plate. In some embodiments, the manufactured arm can then be finished, for example for aesthetic purposes (e.g., sand blasted and nickel plated). Process 400 can then end at step 420.

The above-described embodiments of the present invention are presented for purposes of illustration and not of limitation, and the present invention is limited only by the claims which follow.

What is claimed is:

1. A method for manufacturing a power adapter plug arm, comprising:

lathing a stem in a bar, the bar comprising a plug operative to engage a power receptacle;

bending the stem, wherein the length of the bent portion of the stem is at least equal to half of the length of the un-bent portion of the bar; and cold heading the bent portion of the stem to create a substantially planar plate.

2. The method of claim 1, wherein cold heading further comprises creating a plate substantially perpendicular to the axis of the unbent portion of the bar.

3. The method of claim 1, further comprising:

at least one of grinding and milling the plug in the bar, wherein the plug and the stem are substantially co-axial.

4. The method of claim 1, further comprising:

processing the stem to create a polygonal cross-section.

5. The method of claim 1, wherein cold heading further comprises defining the periphery of the plate.

6. The method of claim 1, further comprising punching a hole in the plate, the hole located at a portion of the plate corresponding to the end of the bent portion of the stem.

7. The method of claim 6, further comprising: placing a pin in the hole, the pin extending from the surface of the plate opposite the surface from which the un-bent portion of the bar extends.

8. The method of claim 7, further comprising: coupling the pin to the plate using a swaging process.

9. A method for manufacturing a plug arm, comprising: forming a bar from a single piece of metal; bending the bar to define a plug insert portion angled relative to a cold stamped portion, wherein:
the plug insert portion comprises a plug and a stem, wherein the plug comprises a surface perpendicular to a central axis of the plug insert portion at an interface between the plug and the stem, and wherein the surface comprises a band between a periphery of the plug and a periphery of the stem around the entirety of the periphery of the stem; and
the cold stamped portion comprises a thin and flat surface perpendicular to the central axis of the plug insert portion.

10. The method of claim 9, further comprising: constructing a bridge portion connecting the plug insert portion to one end of the cold stamped portion.

11. The method of claim 9, further comprising: grinding the plug insert portion to distinguish the stem from the plug.

12. The method of claim 11, further comprising: processing the stem to create a polygonal cross-section.

13. The method of claim 9, further comprising: punching a hole in the plate, the hole located adjacent to an end of the bar.

14. The method of claim 13, further comprising: placing a pin in the hole.

15. The method of claim 14, wherein: the pin extends from a surface of the plate opposite the surface from which the plug insert portion extends.

16. The method of claim 13, further comprising: coupling the pin to the plate using a swaging process.

* * * * *